(12) United States Patent
Ishii (10) Patent No.: US 10,892,241 B2
(45) Date of Patent: Jan. 12, 2021

(54) SUBSTRATE DEVICE, ELECTRONIC APPARATUS, AND METHOD FOR MANUFACTURING SUBSTRATE DEVICE

(71) Applicant: SONY CORPORATION, Tokyo (JP)

(72) Inventor: Shigekazu Ishii, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/307,091

(22) PCT Filed: May 15, 2017

(86) PCT No.: PCT/JP2017/018256
§ 371 (c)(1),
(2) Date: Dec. 4, 2018

(87) PCT Pub. No.: WO2017/221587
PCT Pub. Date: Dec. 28, 2017

(65) Prior Publication Data
US 2019/0164923 A1    May 30, 2019

(30) Foreign Application Priority Data
Jun. 20, 2016   (JP) ................. 2016-121738

(51) Int. Cl.
*H01L 23/00* (2006.01)
(52) U.S. Cl.
CPC .............. *H01L 24/17* (2013.01); *H01L 24/09* (2013.01); *H01L 24/11* (2013.01); *H01L 24/13* (2013.01);
(Continued)

(58) Field of Classification Search
CPC ..... H01L 24/13; H01L 2224/81; H01L 24/11; H01L 2224/11; H01L 2224/16;
(Continued)

(56) References Cited

U.S. PATENT DOCUMENTS

2006/0094226 A1    5/2006   Huang et al.
2011/0193218 A1*   8/2011   Arvin ................ H01L 23/49811
                                                                257/737
(Continued)

FOREIGN PATENT DOCUMENTS

CN    102237316 A    11/2011
CN    103299410 A     9/2013
(Continued)

OTHER PUBLICATIONS

International Search Report and Written Opinion of PCT Application No. PCT/JP2017/018256, dated Jul. 18, 2017, 02 pages of translation and 09 pages of ISRWO.

*Primary Examiner* — Jasmine J Clark
(74) *Attorney, Agent, or Firm* — Chip Law Group (57) ABSTRACT

To provide a substrate device, an electronic apparatus, and a method for manufacturing a substrate device that can make large the gap between a semiconductor substrate and a wiring substrate by making the height of a solder ball high. A substrate device includes a substrate; an electrical connection unit provided on the substrate; a metal post provided on the electrical connection unit; and a metal film that is provided in one body from a tip surface to at least part of a side surface of the metal post and of which wettability to a solder material is lower than wettability to the solder material of the metal post.

16 Claims, 8 Drawing Sheets

(52) U.S. Cl.
CPC .............. *H01L 24/81* (2013.01); *H01L 24/16* (2013.01); *H01L 2224/0401* (2013.01); *H01L 2224/05568* (2013.01); *H01L 2224/10145* (2013.01); *H01L 2224/11* (2013.01); *H01L 2224/119* (2013.01); *H01L 2224/1146* (2013.01); *H01L 2224/1181* (2013.01); *H01L 2224/11334* (2013.01); *H01L 2224/11462* (2013.01); *H01L 2224/11472* (2013.01); *H01L 2224/11825* (2013.01); *H01L 2224/11849* (2013.01); *H01L 2224/11906* (2013.01); *H01L 2224/13023* (2013.01); *H01L 2224/13083* (2013.01); *H01L 2224/13566* (2013.01); *H01L 2224/16238* (2013.01); *H01L 2224/73204* (2013.01); *H01L 2224/8121* (2013.01); *H01L 2224/81191* (2013.01); *H01L 2224/81815* (2013.01); *H01L 2224/83104* (2013.01); *H01L 2224/92125* (2013.01); *H01L 2924/0105* (2013.01); *H01L 2924/01028* (2013.01); *H01L 2924/01029* (2013.01); *H01L 2924/35* (2013.01)

(58) Field of Classification Search
CPC ................. H01L 24/17; H01L 2224/13; H01L 2224/11849; H01L 2224/83104; H01L 2224/11825; H01L 2224/81191; H01L 2224/119; H01L 2224/13644; H01L 2224/92125; H01L 2224/2919; H01L 2224/11462; H01L 2914/01029; H01L 2224/81815; H01L 2224/0401; H01L 2224/10145; H01L 2224/1146; H01L 2224/11334; H01L 2224/13147; H01L 2924/00014; H01L 2224/45144; H01L 2224/13155; H01L 2224/81399; H01L 2224/13083; H01L 24/16; H01L 2224/05147

See application file for complete search history.

(56) References Cited

U.S. PATENT DOCUMENTS

| | | |
|---|---|---|
| 2011/0260317 A1 | 10/2011 | Lu et al. |
| 2012/0295434 A1 | 11/2012 | Cho et al. |
| 2014/0138134 A1 | 5/2014 | Imafuji et al. |
| 2015/0311170 A1* | 10/2015 | Arvin .................... H01L 24/11 438/614 |
| 2015/0371962 A1 | 12/2015 | Akamatsu |
| 2016/0079193 A1 | 3/2016 | Arvin et al. |
| 2016/0322321 A1* | 11/2016 | Yajima ................... H01L 24/13 |

FOREIGN PATENT DOCUMENTS

| | | |
|---|---|---|
| JP | 2006-108181 A | 4/2006 |
| JP | 5370599 B2 | 12/2013 |
| JP | 2014-103295 A | 6/2014 |
| JP | 2015-12056 A | 1/2015 |
| JP | 2015-012056 A | 1/2015 |
| JP | 2016-006812 A | 1/2016 |
| JP | 2016-213222 A | 12/2016 |
| KR | 10-2012-0128967 A | 11/2012 |
| TW | 201138040 A | 11/2011 |
| WO | 2012/102303 A1 | 8/2012 |

\* cited by examiner

SUBSTRATE DEVICE, ELECTRONIC APPARATUS, AND METHOD FOR MANUFACTURING SUBSTRATE DEVICE

CROSS REFERENCE TO RELATED APPLICATIONS

This application is a U.S. National Phase of International Patent Application No. PCT/JP2017/018256 filed on May 15, 2017, which claims priority benefit of Japanese Patent Application No. JP 2016-121738 filed in the Japan Patent Office on Jun. 20, 2016. Each of the above-referenced applications is hereby incorporated herein by reference in its entirety.

TECHNICAL FIELD

The present disclosure relates to a substrate device, an electronic apparatus, and a method for manufacturing a substrate device.

BACKGROUND ART

These days, reductions in size and increases in performance of electronic apparatuses such as mobile phones, personal digital assistants (PDAs), and notebook personal computers are in progress. Hence, semiconductor devices to be incorporated into these electronic apparatuses need to adapt to higher density mounting. In order to adapt to high density mounting, it is required to miniaturize terminals and wiring patterns and downsize the semiconductor device.

Here, in association with the downsizing of the semiconductor device, a surface-mount type is employed as a mounting structure of the semiconductor device. Examples of the mounting structure of a surface-mount semiconductor device include a flip chip mounting method. In the flip chip mounting method, semiconductor devices of a ball grid array (BGA) type and a land grid array (LGA) type are used, and the bonding of a semiconductor device and a wiring substrate is performed via bumps, for example. After the semiconductor device and the wiring substrate are bonded together, a sealing resin is poured and cured between the semiconductor device and the wiring substrate, and thereby the bonding strength is increased.

The pitch of bumps is narrowed in accordance with the downsizing of semiconductor devices and the miniaturization of terminals and wiring patterns. As a bump for adapting to narrower pitches, for example, a pillar bump of a structure in which a metal post containing a metal such as copper is provided on a semiconductor substrate and a solder ball with a low melting point is placed on the tip of the metal post is used. In a situation where further narrowing of the pitch of bumps progresses, there is a desire to make the height of the pillar bump high in order to ensure a space for pouring a sealing resin.

For example, Patent Literature 1 discloses a semiconductor device that includes a plurality of columnar electrodes (metal posts) provided on a semiconductor substrate and that is provided in a state where the columnar electrodes are exposed, and in which the columnar electrode includes a columnar unit containing an electrically conductive material and a metal ball unit containing an electrically conductive material having a lower melting point than the columnar unit, the columnar unit and the metal ball unit are bonded together by means of only the upper surface of the columnar unit, and treatment is not performed on the side surface of the columnar unit.

CITATION LIST

Patent Literature

Patent Literature 1: JP 2006-108181A

DISCLOSURE OF INVENTION

Technical Problem

Here, a columnar unit is generally formed by the electrolytic plating method or the like, as described in Patent Literature 1, and it takes a long time to make the height of the columnar unit high. Further, the columnar unit formed by the electrolytic plating method or the like is a portion that may be integrated with a substrate; then, when stress is applied to the bonding portion due to plastic deformation or the like after the semiconductor device and a wiring substrate are bonded together, the stress is absorbed mainly by the portion of the metal ball. Hence, when making the height of the pillar bump high, it is desired to make the height of the metal ball high.

However, the semiconductor device described in Patent Literature 1 is manufactured by forming a low-melting point layer directly on the upper surface of the columnar unit by solder plating and then heating and melting the low-melting point layer to fashion it into a ball-like shape. Tin, which is a constituent material of the metal ball, has relatively high wettability to copper, which is a constituent material of the columnar unit; therefore, if it is attempted to increase the diameter of the metal ball, the solder material is likely to run down to the side surface side of the columnar unit when subjected to reflow processing; thus, there is a limit to increase the diameter of the metal ball.

Thus, the present disclosure proposes a substrate device, an electronic apparatus, and a method for manufacturing a substrate device that can make large the gap between a semiconductor substrate and a wiring substrate by making the height of a solder ball high.

Solution to Problem

According to the present disclosure, there is provided a substrate device including: a substrate; an electrical connection unit provided on the substrate; a metal post provided on the electrical connection unit; and a metal film that is provided in one body from a tip surface to at least part of a side surface of the metal post and of which wettability to a solder material is lower than wettability to the solder material of the metal post.

In addition, according to the present disclosure, there is provided an electronic apparatus including: a mounting structure of a semiconductor device, the mounting structure including a first substrate including a first electrical connection unit on a substrate surface, a second substrate including a second electrical connection unit on a substrate surface, a metal post provided on the first electrical connection unit, a solder ball that electrically connects the second electrical connection unit and the metal post together, a sealing resin put in a gap between the first substrate and the second substrate, and a metal film that is provided between the metal post and the solder ball in one body from a tip surface to at least part of a side surface of the metal post and of which wettability to the solder ball is lower than wettability to the solder ball of the metal post.

In addition, according to the present disclosure, there is provided a method for manufacturing a substrate device, including: forming, on a substrate including an electrical connection unit on a substrate surface, a photosensitive material layer having an opening portion superimposed on the electrical connection unit; forming a metal post in the opening portion of the photosensitive material layer; subjecting the photosensitive material layer to light exposure treatment by using a photomask having a light transmissive portion that is superimposed on the opening portion of the photosensitive material layer and further has a larger outer diameter than the opening portion; forming a metal film of which wettability to a solder material is lower than wettability to the solder material of the metal post, in one body from a tip surface to at least part of a side surface of the metal post; and removing the photosensitive material layer.

Advantageous Effects of Invention

As described above, according to the present disclosure, the height of a bump is made high by making the height of a solder ball high, and the gap between a semiconductor substrate and a wiring substrate can be made large.

Note that the effects described above are not necessarily limitative. With or in the place of the above effects, there may be achieved any one of the effects described in this specification or other effects that may be grasped from this specification.

MODE(S) FOR CARRYING OUT THE INVENTION

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description is given in the following order.
1. First Embodiment
1-1. Configuration example of semiconductor device
1-2. Mounting structure of semiconductor device
1-3. Method for manufacturing semiconductor device
2. Second Embodiment
2-1. Overview of electronic apparatus
2-2. Configuration example of electronic apparatus 1. First Embodiment

[1-1. Configuration Example of Semiconductor Device]

Figure 1:
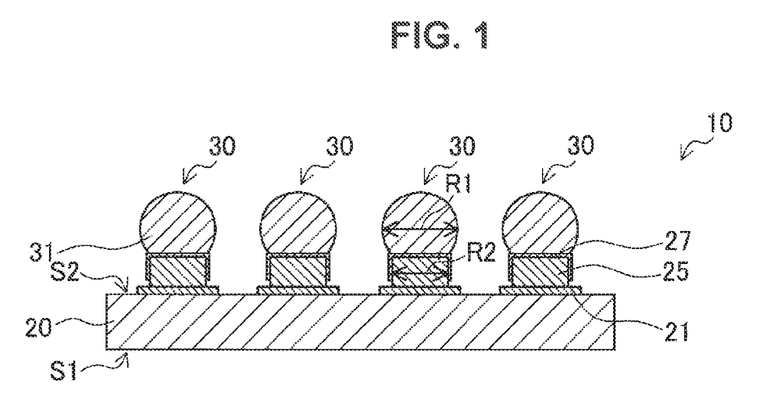
FIG. 1 is a cross-sectional view schematically showing a semiconductor device according to an embodiment of the present disclosure.

First, a configuration example of a semiconductor device 10 according to a first embodiment of the present disclosure is described with reference to FIG. 1. FIG. 1 is a cross-sectional view schematically showing a cross-sectional structure of the semiconductor device 10 according to the present embodiment.

As shown in FIG. 1, the semiconductor device 10 includes a semiconductor substrate 20. Although in FIG. 1 the semiconductor substrate 20 is shown as a single-layer substrate, the semiconductor substrate 20 may be a multiple-layer wiring substrate of two or more layers. The semiconductor substrate 20 includes, for example, a silicon substrate or the like, and may be provided with a semiconductor chip that is mounted on its one surface S1 via a not-illustrated adhesive or the like. Electrode terminals are formed on the one surface S1 of the semiconductor substrate 20 and on the semiconductor chip, and the corresponding electrode terminals may be electrically connected together by, for example, a gold wire. Further, the one surface S1 of the semiconductor substrate 20, the semiconductor chip, and the gold wires may be sealed with a sealing resin such as an epoxy resin.

The semiconductor chip may be an arithmetic processing element such as a micro processing unit (MPU), an integrated circuit element such as a power management integrated circuit (PMIC) or an authentication chip, a storage element such as a synchronous dynamic random access memory (SDRAM) or a flash memory, or the like, for example.

A plurality of electrode pads 21 as electrical connection units (first electrical connection units) are formed on another surface S2 of the semiconductor substrate 20. A seed layer containing copper (Cu) or the like may be provided on the other surface S2 of the semiconductor substrate 20. The electrode pad 21 contains a metal material such as aluminum (Al), for example. The electrode pad 21 may be a single-layer structure, or may be a stacked structure. Further, the electrical connection unit may be, instead of the electrode pad 21, a rewiring layer that is formed to be drawn out from an electrode pad.

A bump 30 is formed on each of the electrode pads 21. The bump 30 is electrically connected to a not-illustrated wiring substrate or the like, and functions as an input/output terminal to the outside of the semiconductor chip or the like. The bump 30 may be electrically connected to the semiconductor chip or the like via the electrode pad 21, a contact via, a wiring layer, a rewiring layer, a terminal, etc., for example. The bump 30 of the semiconductor device 10 according to the present embodiment serves as a pillar bump in which a solder ball 31 is placed on the upper surface of a metal post 25.

The metal post 25 contains, for example, gold (Au) or Cu, and has a function of making the height of the bump 30 high. In the semiconductor device 10 according to the present embodiment, the metal post 25 contains Cu. The metal post 25 is formed by the electrolytic plating method or the electroless plating method, for example. Hence, if the height of the metal post 25 is too high, the formation of the metal post 25 takes a long time. Further, in a case where the metal post 25 contains Au, there is a concern that the cost needed for the metal post 25 will be high. Further, if the height of the metal post 25 is low, the height of the bump 30 formed is low, and there is a concern that the gap between the semiconductor substrate 20 and a wiring substrate on which the semiconductor device 10 is mounted will be small. The height of the metal post 25 may be 25 to 50 μm, for example.

The solder ball 31 on the metal post 25 is placed via a metal film 27 that has lower wettability to a solder material such as tin (Sn) than the metal post 25 has. Although the metal film 27 has wettability to the solder material, the metal film 27 is a layer having such wettability that the solder material does not wetly spread, and may contain nickel (Ni), for example. The metal film 27 is formed in one body from the upper surface (tip surface) to at least part of the side surface of the metal post 25. Sn—Ni alloy, which is an alloy of Ni and a solder material (Sn), is formed at the bonding interface between the solder ball 31 and the metal film 27, and the solder ball 31 and the metal film 27 are in a state of being alloyed and connected together.

Since the metal film 27 is provided in one body to at least part of the side surface of the metal post 25, the solder ball 31 is bonded to the entire upper surface of the metal post 25 and yet does not run down to the side surface of the metal post 25. That is, since a metal film 27 of which the wettability to the solder material is lower than the wettability of the metal post 25 is provided not only on the tip surface of the metal post 25 but also on the side surface side, the solder material is less likely to run down to the side surface of the metal post 25 during the reflow processing of the solder material. Hence, when the semiconductor device 10 is viewed in the height direction of the metal post 25, the diameter R1 of the solder ball 31 placed on the metal post 25 is made larger than the diameter R2 of the metal post 25. Thereby, the diameter R1 and the height of the solder ball 31 placed on the metal post 25 are increased, and the height of the bump 30 can be made high.

The diameter R1 of the solder ball 31 can be made larger than the diameter R2 of the metal post 25 by more than or equal to 20%, for example. Specifically, the difference between the diameter R1 of the solder ball 31 and the diameter R2 of the metal post 25 may be, for example, within the range of 8 to 20 μm. For example, the diameter R2 of the metal post 25 may be 35 to 70μ, and the diameter R1 of the solder ball 31 may be 40 to 90μ. In this case, in the semiconductor device 10 before being bonded to a wiring substrate, the height of the metal post 25 may be 25 to 50μ, and the height of the solder ball 31 may be 35 to 80μ, for example. Thereby, after the semiconductor device 10 is mounted on a wiring substrate, the gap between the semiconductor substrate 20 and the wiring substrate is made large, and it is easy for a sealing resin to flow into the gap.

The metal film 27 including a Ni film has a thickness of, for example, 1.5 to 4.0μ, and may be formed by the electrolytic plating method or the electroless plating method. Further, the metal film 27 formed on the side surface of the metal post 25 may be formed in an area of at least more than or equal to 5 μm from the upper surface (tip surface) of the metal post 25. For example, in a case where the metal film 27 is formed in an area of 5 μm from the upper surface in the side surface of the metal post 25, the metal film 27 is formed in an area of 6.5 to 9.0 μm from the upper surface of the metal film 27 as the total area including the thickness of the metal film 27 formed on the upper surface. Hence, during the reflow of the solder ball 31 mounted on the upper surface of the metal film 27, the solder material is less likely to come into contact with the metal post 25, which has high wettability to the solder material, and the running-down of the solder material can be prevented.

The metal film 27 may also be formed in an area beyond 5 μm from the upper surface of the metal post 25, and may be formed over the entire side surface of the metal post 25. However, in order to reduce the amount of electrically conductive material used and suppress the cost of the material while preventing the running-down of the solder material, it is sufficient that the metal film 27 be formed in an area of at least more than or equal to 5 μm from the upper surface of the metal post 25.

Further, for example, in a case where the metal film 27 is not provided, the metal post 25 containing Cu and the solder material react together excessively, and the solder material and the metal post 25 tend to melt together; thus, it is difficult to make the height of the bump 30 high. Further, even if a natural oxide film is formed on the surface of the metal post 25 containing Cu, the wettability between the oxide film and the solder material is high all the same, and the solder material is likely to run down to the side surface of the metal post 25. Thus, it is effective to form a metal film 27 having smaller wettability to the solder material than the metal post 25 in one body from the upper surface to at least part of the side surface of the metal post 25.

[1-2. Mounting Structure of Semiconductor Device]

Figure 2:
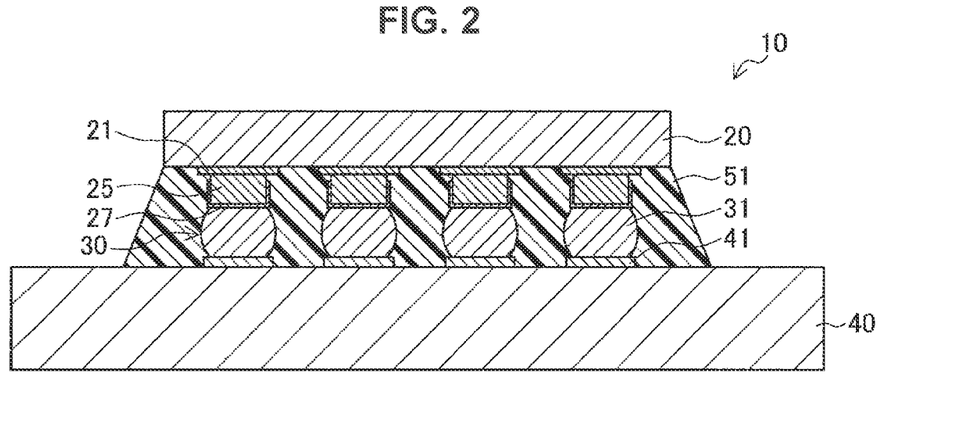
FIG. 2 is a cross-sectional view schematically showing a mounting structure of a semiconductor device according to the embodiment.

Next, an example of the mounting structure of the semiconductor device 10 according to the present embodiment is described with reference to FIG. 2. FIG. 2 is a cross-sectional view schematically showing a cross-sectional structure of the mounting structure of the semiconductor device 10 according to the present embodiment.

As shown in FIG. 2, the semiconductor device 10 is mounted on a wiring substrate 40 via bumps 30. A plurality of electrode pads 41 as electrical connection units (second electrical connection units) are formed on one surface of the wiring substrate 40. The solder ball 31 of the bump 30 of the semiconductor device 10 is electrically connected to the electrode pad 41. Further, a sealing resin 51 such as an epoxy resin is put and cured in the gap between the semiconductor substrate 20 and the wiring substrate 40. Thereby, the electrical connection portion between the semiconductor substrate 20 and the wiring substrate 40 is electrically insulated from the surroundings, and an improvement in the bonding strength between the semiconductor substrate 20 and the wiring substrate 40 is achieved.

In a case of the mounting structure of the semiconductor device 10 according to the present embodiment, the solder material is less likely to go around to the side surface of the metal post 25 even during the mounting of the semiconductor device 10; consequently, the height of the solder ball 31 is kept at a prescribed level, and the height of the bump 30 after the semiconductor device 10 is mounted can be made high. Therefore, the gap between the semiconductor substrate 20 and the wiring substrate 40 is made large, and it is easy for a sealing resin poured between the semiconductor device 10 and the wiring substrate 40 to be put in without a gap; thus, the electrical insulating properties of the electrical connection portion and the bonding strength between the semiconductor device 10 and the wiring substrate 40 can be enhanced.

[1-3. Method for Manufacturing Semiconductor Device]

Next, an example of the method for manufacturing the semiconductor device 10 according to the present embodiment is described with reference to FIG. 3 to FIG. 13. FIG. 3 to FIG. 13 are schematic cross-sectional views for describing steps of a method for manufacturing the semiconductor device 10, and show a manner in which two bumps 30 are formed on the semiconductor substrate 20. Note that, in the following description, the direction in which layers are stacked is expressed as "on."

Figure 3:
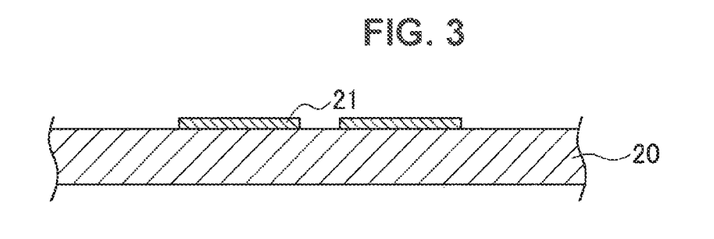
FIG. 3 is an explanatory diagram showing a step of forming an electrical connection unit of a method for manufacturing a semiconductor device according to the embodiment.

First, as shown in FIG. 3, electrode pads 21 are formed on a circuit surface of the semiconductor substrate 20 on which a not-illustrated circuit is formed. As the semiconductor substrate 20, for example, a semiconductor substrate used for a common semiconductor device, such as a silicon substrate, may be used. A not-illustrated seed layer containing Cu or the like may be formed on the surface of the semiconductor substrate 20. The seed layer serves as a conductor when performing plating processing in a later process. Also the electrode pad 21 may include a conductor layer used for a common semiconductor device, such as a layer of Al. Although not illustrated, a passivation film that covers the periphery of the electrode pad 21 and the semiconductor substrate 20 may be formed such that a central portion of the electrode pad 21 is exposed. The passivation film contains SiN or $SiO_2$, for example.

Figure 4:
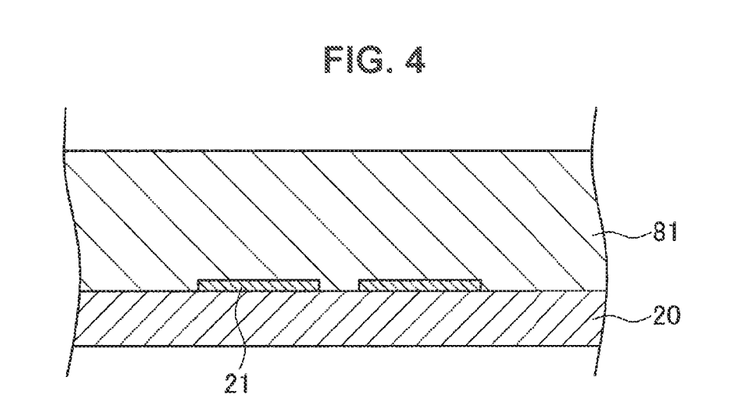
FIG. 4 is an explanatory diagram showing a step of forming a photosensitive material layer of the method for manufacturing a semiconductor device according to the embodiment.

Subsequently, as shown in FIG. 4, a photosensitive material layer 81 is formed on the semiconductor substrate 20 on which the electrode pad 21 is formed. For example, in a case where a bump 30 with a pitch of 100 μm and a height of 70 μm is formed, the thickness of the photosensitive material layer 81 may be within the range of 80 to 1,000μ. To form a photosensitive material layer 81 having such a thickness, for example, a photosensitive material in a dry film form may be pressure-bonded and stuck to the semiconductor substrate 20 by the roll lamination method. However, the photosensitive material layer 81 may be formed by other methods such as the spin coating method. In the present embodiment, a photosensitive material layer 81 containing a positive photosensitive material is formed on the semiconductor substrate 20.

Figure 5:
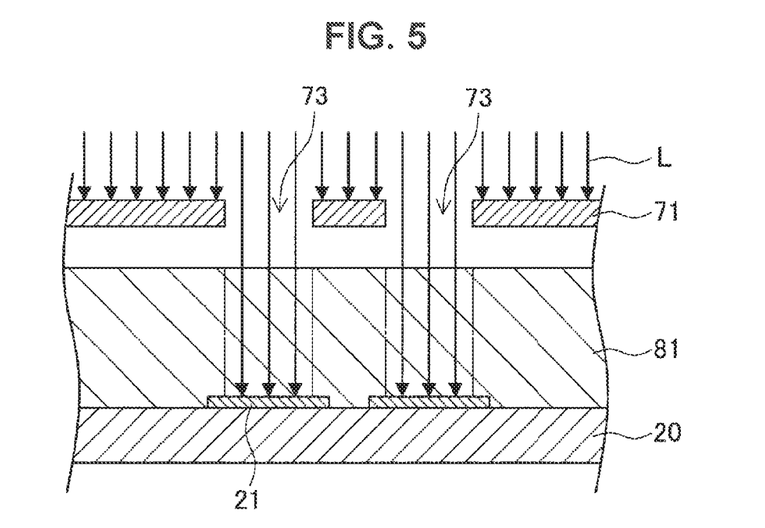
FIG. 5 is an explanatory diagram showing a first light exposure treatment process of the method for manufacturing a semiconductor device according to the embodiment.

Subsequently, as shown in FIG. 5, a first light exposure treatment is performed on the photosensitive material layer 81 by using a first photomask 71 having first light transmissive portions 73, with ultraviolet light L or the like. The first light transmissive portion 73 provided in the first photomask 71 used in the first light exposure treatment has a planar shape and a size corresponding to the planar shape of the metal post 25 to be formed. For example, the planar shape of the first light transmissive portion 73 may be a circular shape, and the diameter may be 50μ. After the first light exposure treatment is performed using the first photomask 71, development processing is performed, and parts of the photosensitive material layer 81 exposed to light via the first light transmissive portions 73 are removed.

Figure 6:
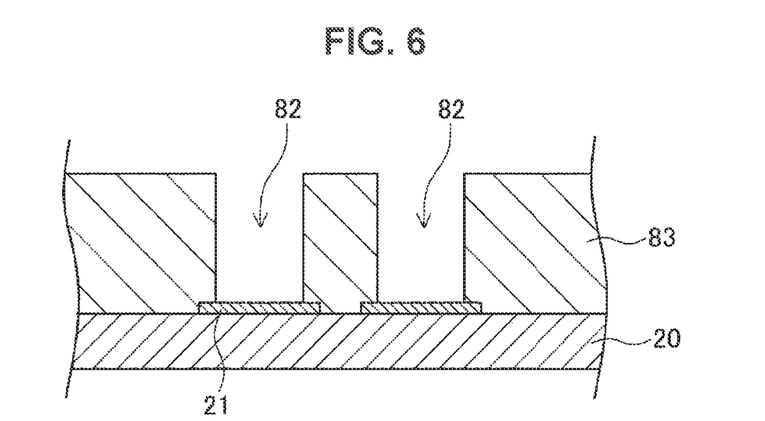
FIG. 6 is an explanatory diagram showing a first opening portion formed in the photosensitive material layer.

After the development processing, post-baking treatment of the photosensitive material layer 81 is performed, and the remaining photosensitive material layer 81 is baked tightly and solidified. Thereby, as shown in FIG. 6, a photosensitive material layer 83 having first opening portions 82 superimposed on the electrode pads 21 is formed. The first opening portion 82 may be located on a central area of the electrode pad 21. In this event, the photosensitivity capacity of the photosensitive material layer 83 formed is reserved by setting post-baking treatment conditions as appropriate. For example, the post-baking temperature may be set lower or the post-baking time may be set shorter than in normal use conditions of photosensitive materials, or optimum conditions may be set by a combination of these.

Figure 7:
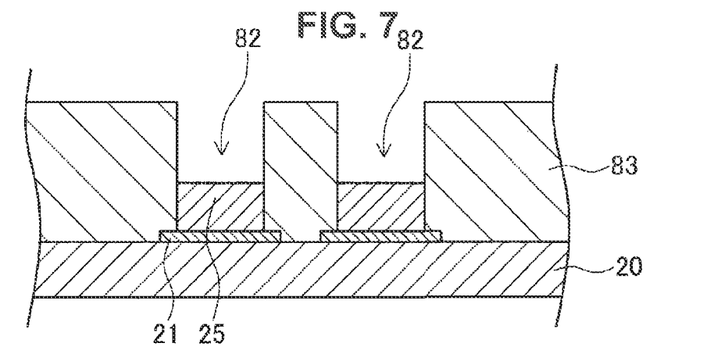
FIG. 7 is an explanatory diagram showing a step of forming a metal post of the method for manufacturing a semiconductor device according to the embodiment.

Subsequently, as shown in FIG. 7, the metal post 25 is formed in the first opening portion 82 of the photosensitive material layer 83. The metal post 25 contains, for example, Cu, and its height (thickness) may be within the range of 30 to 40μ. A metal post 25 with such a height may be formed by the electrolytic plating method, for example. In this case, the metal post 25 may be formed using Cu in view of electrical characteristics as an electrically conductive material, plating growth speed, the cost of the material, etc. The metal post 25 formed has a diameter substantially equal to the diameter of the first opening portion 82 of the photosensitive material layer 83.

Figure 8:
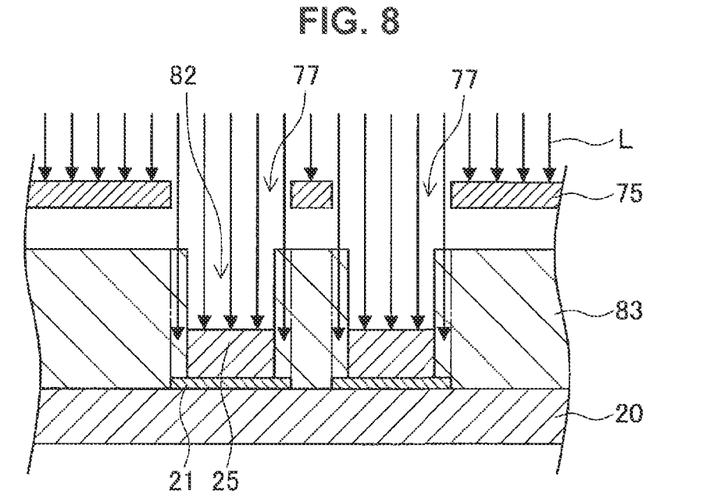
FIG. 8 is an explanatory diagram showing a second light exposure treatment process of the method for manufacturing a semiconductor device according to the embodiment.

Subsequently, as shown in FIG. 8, a second light exposure treatment is performed on the photosensitive material layer 83 by using a second photomask 115 having second light transmissive portions 77, with ultraviolet light L or the like. In the second light exposure treatment, a second photomask 115 having second light transmissive portions 77 each of which has an outer diameter larger than the outer diameter of the first light transmissive portion 73 of the first photomask 71 is used in order to expand the opening area of the first opening portion 82 formed in the photosensitive material layer 83. That is, the second light transmissive portion 77 of the second photomask 115 is larger than the outer diameter of the first opening portion 82 of the photosensitive material layer 83. For example, the diameter of the second light transmissive portion 77 may be 60μ. The second light transmissive portion 77 of the second photomask 115 is placed so as to be superimposed on the first opening portion 82 of the photosensitive material layer 83. The first opening portion 82 may be placed so as to be located in a central area of the second light transmissive portion 77. Therefore, in the second light exposure treatment, light exposure treatment can be performed on the photosensitive material layer 83 around the first opening portion 82.

Further, in the second light exposure treatment, the light exposure time is set short so that development is not performed up to the bottom surface of the photosensitive material layer 83 exposed to light. Alternatively, in the second light exposure treatment, the amount of light during light exposure may be set small. Thereby, the concern that the photosensitive material layer 83 around the metal post 25 will be removed up to the bottom surface and the seed layer under the electrode pad 21 will be exposed can be reduced. After the second light exposure treatment is performed using the second photomask 115, development processing is performed, and parts of the photosensitive material layer 83 exposed to light via the second light transmissive portions 77 are removed. After the development processing, post-baking treatment of the photosensitive material layer 83 is performed, and the remaining photosensitive material layer 83 is baked tightly and solidified.

Figure 9:
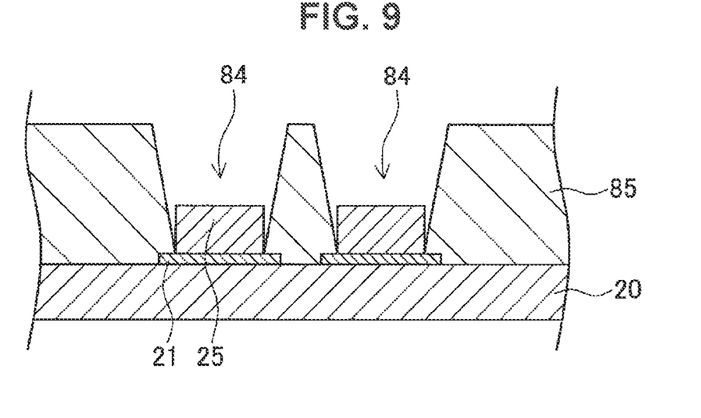
FIG. 9 is an explanatory diagram showing a second opening portion formed in the photosensitive material layer.

Thereby, as shown in FIG. 9, second opening portions 84 each of which has an opening area larger than the opening area of the first opening portion 82 are formed in a photosensitive material layer 85, and the side surface of the metal post 25 can be caused to be exposed without causing the electrode pad 21 around the metal post 25 to be exposed largely. Although in FIG. 9 the wall surface of the second opening portion 84 is schematically shown in an included shape, the wall surface of the second opening portion 84 may not necessarily be in an inclined shape.

In this event, the entire side surface of the metal post 25 may be caused to be exposed, or only a prescribed area from the upper end (tip) in the side surface of the metal post 25 may be caused to be exposed. However, since in a later process the metal film 27 is formed in an area of at least more than or equal to 5 μm from the upper end in the side surface of the metal post 25, an area of more than or equal to at least 5 μm from the upper end in the side surface of the metal post 25 may be caused to be exposed. Further, in the post-baking treatment after the second light exposure treatment, tight baking may be performed such that the photosensitivity capacity of the photosensitive material layer 85 is not reserved.

Figure 10:
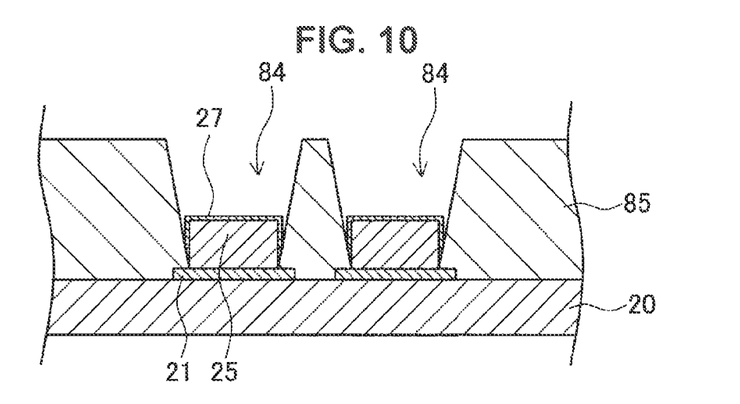
FIG. 10 is an explanatory diagram showing a step of forming a metal film of the method for manufacturing a semiconductor device according to the embodiment.

Subsequently, as shown in FIG. 10, the metal film 27 is formed on the surface of the metal post 25 in the second opening portion 84 of the photosensitive material layer 85 by using the electrolytic plating method. The metal film 27 includes, for example, a Ni film, and is formed in one body from the upper surface to the side surface of the metal post 25. In this event, the metal film 27 is formed in an area of at least more than or equal to 5 μm from the upper end of the metal post 25 in the side surface of the metal post 25, for example.

Figure 11:
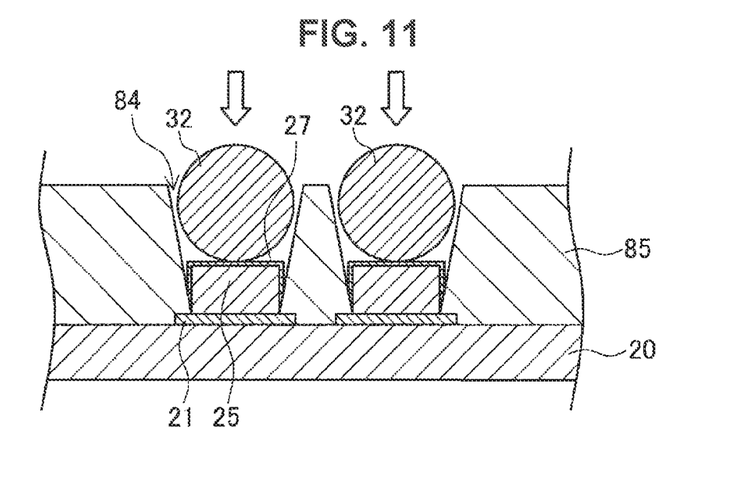
FIG. 11 is an explanatory diagram showing a step of placing a spherical solder material of the method for manufacturing a semiconductor device according to the embodiment.

Subsequently, as shown in FIG. 11, a spherical solder material 32 is mounted in the second opening portion 84 of the photosensitive material layer 85. Electroless metal plating with a prescribed film thickness may be formed on the surface of the spherical solder material 32 by using Ni, Au, or the like. In this event, the spherical solder material 32 may be placed in the second opening portion 84 by a ball drop system. In the method for manufacturing the semiconductor device 10 according to the present embodiment, for example, in a case where the diameter (R2) of the metal post 25 is 50 μm, a spherical solder material 32 with a diameter (R1) of 60 μm is used in order to form, on the metal post 25, a solder ball 31 having a diameter (R1) larger than the diameter (R2) of the metal post 25.

In a method in which a spherical solder material 32 placed by a ball drop system is subjected to reflow processing, a spherical solder material 32 that is formed with a diameter (R1) larger than the diameter (R2) of the metal post 25 in advance can be used, and thereby a solder ball 31 with a desired diameter (R1) can be formed easily. In particular, in the method for manufacturing the semiconductor device 10 according to the present embodiment, a second opening portion 84 with a diameter larger than the diameter (R2) of the metal post 25 is formed in the photosensitive material layer 85 by the second light exposure treatment, and therefore the spherical solder material 32 can be accommodated in the second opening portion 84.

Figure 12:
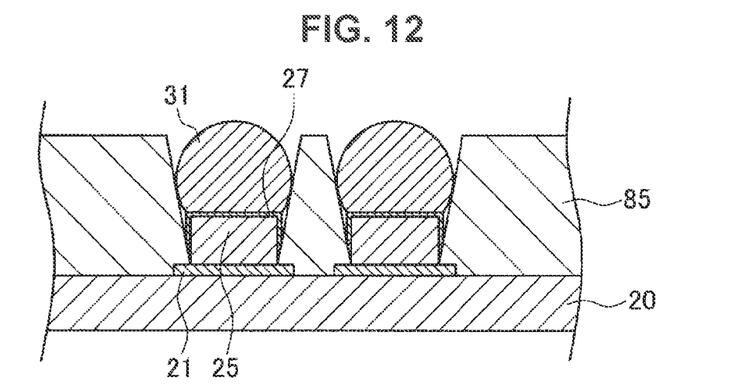
FIG. 12 is an explanatory diagram showing a step of subjecting the solder material to reflow processing of the method for manufacturing a semiconductor device according to the embodiment.

After the spherical solder material 32 is placed on the metal post 25, flux is applied over the entire surface by the spraying method or the like, and the workpiece is introduced into a reflow furnace to be subjected to reflow processing. Thereby, the solder material 32 with a low melting point melts, and the interface between the solder ball 31 and the metal film 27 is alloyed and bonded as shown in FIG. 12. In this event, a metal film 27 having lower wettability to the solder material than the metal post 25 has been formed in one body not only on the upper surface but also to the side surface of the metal post 25, and therefore the solder material does not run down to the side surface of the metal post 25. Thus, the height of the bump 30 formed can be made high.

Further, the center of the solder ball 31 formed is located on the center axis of the metal post 25. Therefore, a solder ball 31 having a diameter (R1) larger than the diameter (R2) of the metal post 25 is formed on the metal post 25 so as to protrude equally in the diameter directions of the metal post 25. Thereby, the pitch of the solder balls 31 of the plurality of bumps 30 formed on the semiconductor substrate 20 is equalized. Therefore, an area where a sealing resin that is poured between the semiconductor substrate 20 and a wiring substrate during the mounting of the semiconductor device 10 is less likely to pass is not formed.

Figure 13:
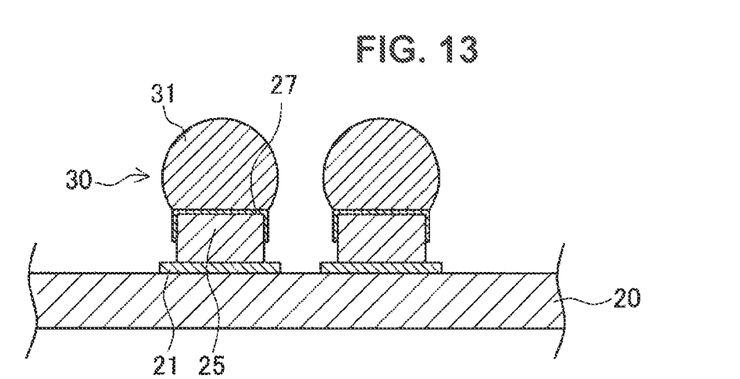
FIG. 13 is an explanatory diagram showing a state where the photosensitive material layer is removed.

After the semiconductor substrate 20 is subjected to reflow processing, the flux adhering on the semiconductor substrate 20 is cleaned off, and further the photosensitive material layer 85 is removed; thereby, as shown in FIG. 13, a bump 30 in which the total height of the metal post 25 and the solder ball 31 is, for example, approximately 70 μm is formed. In the method for manufacturing the semiconductor device 10 according to the present embodiment, a film-like photosensitive material is stuck on the semiconductor substrate 20, and hence the photosensitive material layer 85 can be removed by peeling off the film-like photosensitive material.

Hereinabove, a method for manufacturing the semiconductor device 10 according to the present embodiment is described; then, a method for mounting the semiconductor device 10 on the wiring substrate 40 is described with reference to FIG. 14 to FIG. 16.

Figure 14:
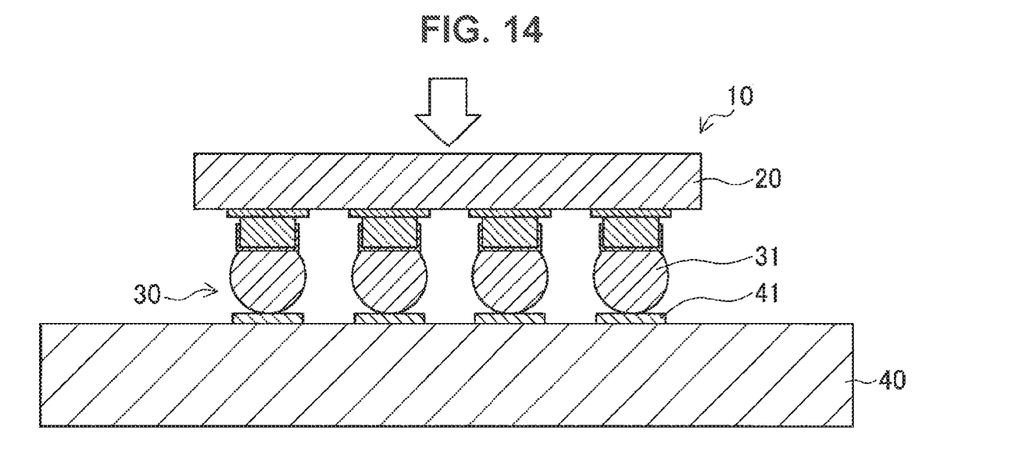
FIG. 14 is an explanatory diagram showing a step of mounting the semiconductor device on a wiring substrate.
Figure 15:
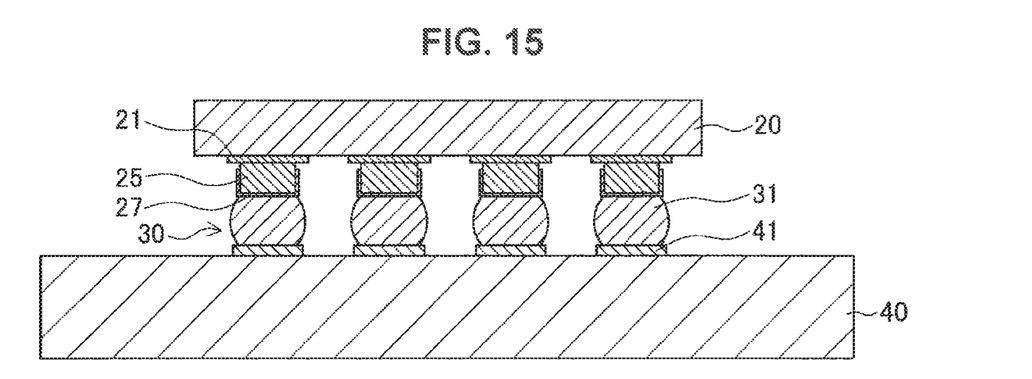
FIG. 15 is an explanatory diagram showing a step of subjecting the solder material to reflow processing.

As shown in FIG. 14, a surface of the semiconductor substrate (a first substrate) 20 on which the bumps 30 are formed is made to face the wiring substrate (a second substrate) 40 including electrode pads 41 on a substrate surface, and the semiconductor device 10 is mounted on the wiring substrate 40. Subsequently, the wiring substrate 40 and the semiconductor device 10 are introduced into a reflow furnace to be subjected to reflow processing; thereby, as shown in FIG. 16, the solder ball 31 with a low melting point melts, and the interface between the solder ball 31 and the electrode pad 41 on the wiring substrate 40 is alloyed and bonded. The height of the bump 30 that had a height of approximately 70 μm before the reflow processing becomes approximately 65μ, for example.

Figure 16:
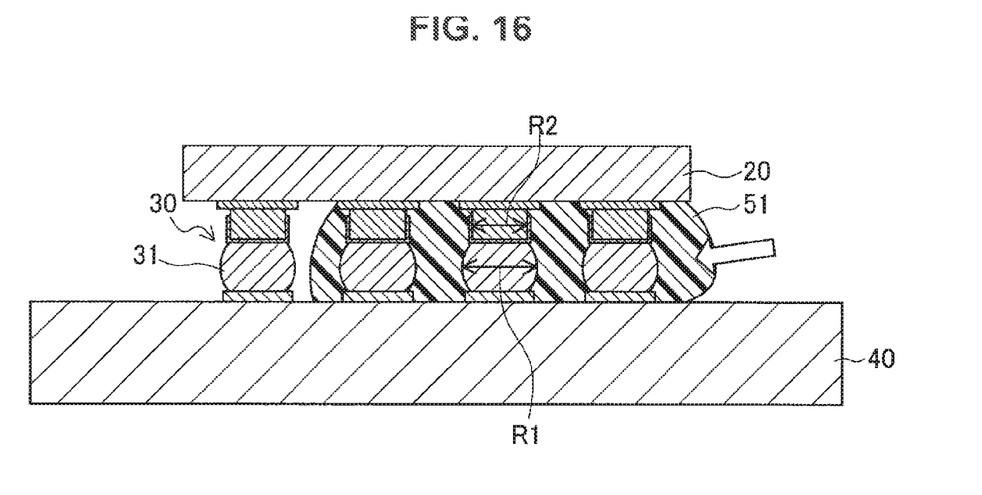
FIG. 16 is an explanatory diagram showing a step of supplying a sealing resin.

Subsequently, as shown in FIG. 16, the sealing resin 51 is poured and cured between the semiconductor substrate 20 and the wiring substrate 40. As the sealing resin 51, for example, an epoxy resin may be used, but other resin materials may be used. The sealing resin has electrically insulating properties, and is cured by, for example, heating treatment. In this event, in the semiconductor device 10 according to the present embodiment, the diameter R1 of the solder ball 31 has been set larger than the diameter R2 of the metal post 25, and the height of the bump 30 has been made high; thus, the gap between the semiconductor substrate 20 and the wiring substrate 40 is large. Therefore, it is easy for the sealing resin 51 to flow between the semiconductor substrate 20 and the wiring substrate 40. Thereby, the insulating properties of the electrical connection portion between the semiconductor device 10 and the wiring substrate 40 are ensured, and furthermore an improvement in the connection strength between the semiconductor device 10 and the wiring substrate 40 is achieved.

As described hereinabove, the semiconductor device 10 according to the present embodiment includes the metal film 27 that is formed from the tip surface to at least part of the side surface of the metal post 25 included in the bump 30 and of which the wettability to the solder material is lower than the wettability of the metal post 25. Therefore, the solder material is less likely to run down to the side surface of the metal post 25 during the reflow processing of the solder material. Hence, the diameter R1 of the solder ball 31 can be made larger than the diameter R2 of the metal post 25 when the semiconductor device 10 is viewed in the height direction of the metal post 25, and the height of the solder ball 31 can be made high. Therefore, the height of the bump 30 is high, and it is easy for a sealing resin to flow between the semiconductor substrate 20 and the wiring substrate 40 during the mounting of the semiconductor substrate 20. As a result, the insulating properties of the electrical connection portion are improved, and furthermore the bonding strength between the semiconductor device 10 and the wiring substrate 40 is improved.

Further, by making the height of the bump 30 high by the height of the solder ball 31 being made high, when stress is applied to the bonding portion after the semiconductor device 10 is mounted, the stress is absorbed by the bump 30 easily, and electrical connection characteristics are improved.

Further, the method for manufacturing the semiconductor device 10 according to the present embodiment performs the first light exposure treatment on the photosensitive material layer 81 by using the first photomask 71 having the first light transmissive portion 73, and forms the first opening portion 82 for forming the metal post 25. After that, post-baking treatment is performed such that photosensitivity capacity is reserved. Further, the second light exposure treatment is performed on the left photosensitive material layer 83 by using the second photomask 115 having the second light transmissive portion 77 that has a larger outer diameter than the first light transmissive portion 73, and the diameter of the first opening portion 82 is expanded. Thereby, the side surface of the metal post 25 is exposed, and the metal film 27 can be formed in one body from the upper surface to the side surface of the metal post 25.

Further, since the diameter of the second opening portion 84 formed in the photosensitive material layer 85 is larger than the diameter R2 of the metal post 25, a spherical solder material 32 with a diameter R1 larger than the diameter R2 of the metal post 25 can be introduced into the second opening portion 84. Therefore, a solder ball 31 with a desired diameter R1 can be formed on the metal post 25 easily by subjecting the spherical solder material 32 to reflow processing. Thereby, the height of the solder ball 31 on the metal post 25 can be made high, and the height of the bump 30 formed can be made high. Therefore, it is easy for a sealing resin to flow into the gap between the semiconductor substrate 20 and the wiring substrate 40.

2. Second Embodiment

Next, an electronic apparatus according to a second embodiment of the present disclosure is described with reference to FIG. 17 and FIG. 18. The electronic apparatus according to the second embodiment is an electronic apparatus including a semiconductor device according to the first embodiment.

[2-1. External Appearance Example of Electronic Apparatus]

First, an overview of an electronic apparatus 100 according to the present embodiment is described with reference to FIG. 17. FIG. 17 is a perspective view showing an external appearance example of the electronic apparatus 100 according to the present embodiment.

Figure 17:
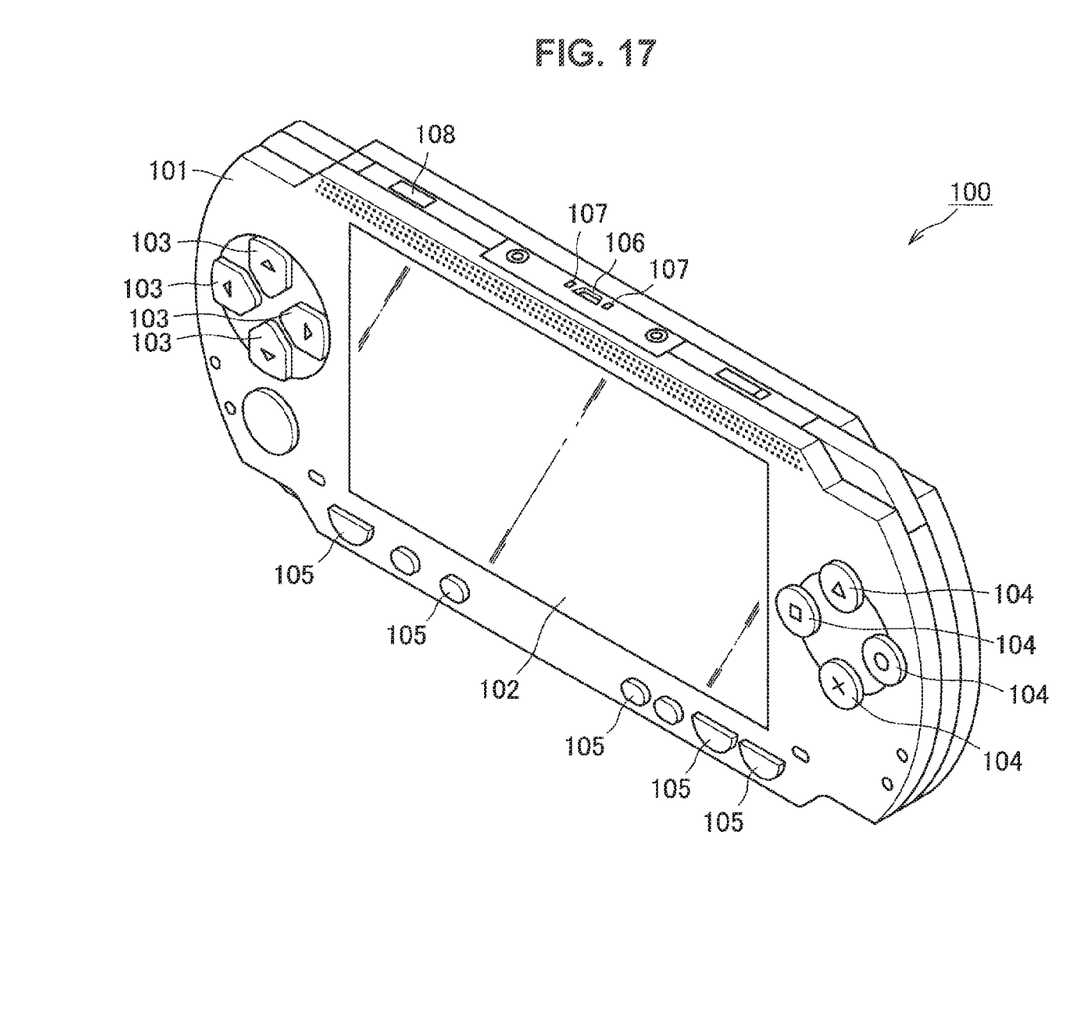
FIG. 17 is a perspective view showing an external appearance example of an electronic apparatus according to a second embodiment of the present disclosure.

As shown in FIG. 17, the electronic apparatus 100 has an external appearance in which configurations are arranged inside and outside a casing 101 formed in a horizontally long, flat shape, for example. The electronic apparatus 100 may be an apparatus used as a game apparatus, for example.

On the front surface of the casing 101, a display panel 102 is provided in a central portion in the longitudinal direction. Further, on the left and right sides of the display panel 102, manipulation keys 103 and manipulation keys 104 that are arranged apart from each other in the circumferential direction are provided. Further, manipulation keys 105 are provided in a lower end portion of the front surface of the casing 101. Manipulation keys 103, 104, and 105 function as direction keys, determination keys, etc., and are used for the selection of menu items displayed on the display panel 102, the progress of a game, etc.

Further, a connection terminal 106 for connecting external apparatuses, supply terminals 107 for electric power supply, a light receiving window 108 or the like through which infrared communication with external apparatuses is performed, etc. are provided on the upper surface of the casing 101.

[2-2. Configuration Example of Electronic Apparatus]

Next, a circuit configuration of the electronic apparatus 100 is described with reference to FIG. 18. FIG. 18 is a block diagram showing the configuration of the electronic apparatus 100 according to the present embodiment.

Figure 18:
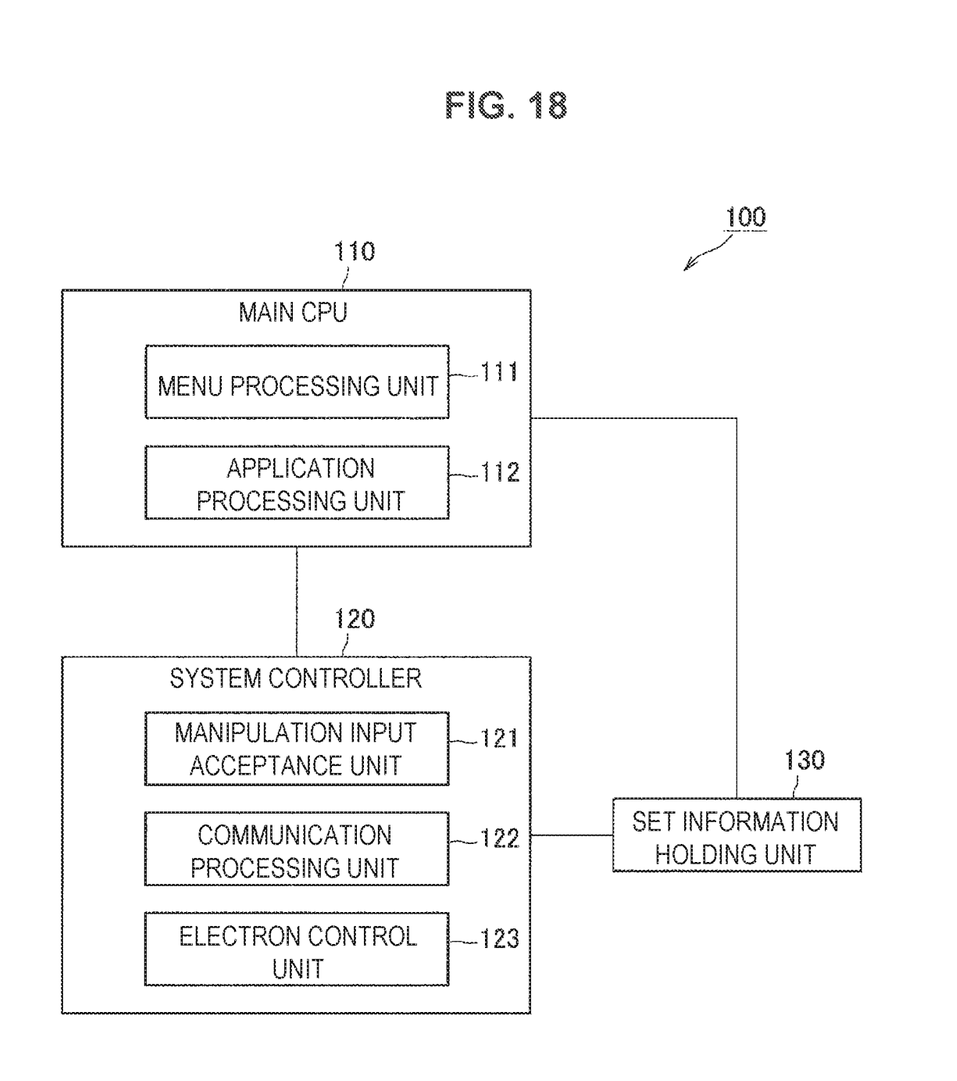
FIG. 18 is a block diagram showing a configuration of an electronic apparatus according to the embodiment.

As shown in FIG. 18, the electronic apparatus 100 includes a main central processing unit (CPU) 110 and a system controller 120. Electric power is supplied to the main CPU 110 and the system controller 120 by different systems from a not-illustrated battery or the like, for example.

The main CPU 110 includes a menu processing unit 111 that creates a menu screen for allowing the user to set various pieces of information or select applications and an application processing unit 112 that executes applications.

Further, the electronic apparatus 100 includes a set information holding unit 130 that holds various pieces of information set by the user, such as a memory. Information set by the user by means of the main CPU 110 is sent out to the set information holding unit 130, and the set information holding unit 130 holds the sent-out information.

The system controller 120 includes a manipulation input acceptance unit 121, a communication processing unit 122, and an electric power control unit 123. The manipulation input acceptance unit 121 detects the states of manipulation keys 103, 104, and 105. Further, the communication processing unit 122 performs communication processing with external apparatuses, and the electric power control unit 123 controls electric power to be supplied to each part of the electronic apparatus 100.

Note that a semiconductor device according to the first embodiment may be mounted on at least one of the main CPU 110, the system controller 120, or the set information holding unit 130. By using the semiconductor device according to the first embodiment, the electronic apparatus 100 can be made smaller in size and thinner in width.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure. In addition, it is needless to say that appropriate combinations of the elements described in the present disclosure will come under the technical scope of the present disclosure.

For example, although in the above embodiment the bump 30 including the metal post 25 and the solder ball 31 is formed on the semiconductor substrate 20 included in the semiconductor device 10, the technique of the present disclosure is not limited to this example. A bump including a metal post and a solder ball may be formed on a wiring substrate on which a semiconductor device is to be mounted. Also in this case, the height of the solder ball is made high by forming a metal film in one body from the upper surface to the side surface of the metal post, and the height of the bump can be made high.

Alternatively, the metal post including the metal film mentioned above may be formed on one of a semiconductor substrate and a wiring substrate, and may be bonded to a solder ball formed on the other substrate during mounting. For example, it is possible to employ a method in which, after the metal film 27 is formed from the upper surface to the side surface of the metal post 25, the workpiece is kept in a state where the photosensitive material layer 85 is removed; then, during mounting on a wiring substrate, a solder material is placed on the wiring substrate by printing or the like, and the semiconductor device and the wiring substrate are bonded together with the solder. Also in this case, the melting solder material is less likely to go around to the side surface side of the metal post, and the gap between the semiconductor substrate and the wiring substrate can be made large.

Further, although in the above embodiment a positive photosensitive material is used as the photosensitive material, the technique of the present disclosure is not limited to this example, and a negative photosensitive material may be used.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A substrate device including:
a substrate;
an electrical connection unit provided on the substrate;
a metal post provided on the electrical connection unit; and
a metal film that is provided in one body from a tip surface to at least part of a side surface of the metal post and of which wettability to a solder material is lower than wettability to the solder material of the metal post.

(2)

The substrate device according to (1),
in which the metal film is a nickel film.

(3)

The substrate device according to (1) or (2),
in which the metal film on the side surface of the metal post is provided in an area of at least more than or equal to 5 µm from a tip of the metal post.

(4)

The substrate device according to any one of (1) to (3),
in which a thickness of the metal film located on the tip surface of the metal post is within a range of 1.5 to 3 µm.

(5)

The substrate device according to any one of (1) to (4), including:
a solder ball containing the solder material on the metal film,
in which a diameter of the solder ball is larger than a diameter of the metal post when the substrate device is viewed along a height direction of the metal post.

(6)

The substrate device according to (5),
in which the diameter of the solder ball is larger than the diameter of the metal post by more than or equal to 20%.

(7)

The substrate device according to any one of (1) to (6),
in which the substrate is a semiconductor substrate, and the substrate device is a semiconductor device.

(8)

An electronic apparatus including:
a mounting structure of a semiconductor device,
the mounting structure including
a first substrate including a first electrical connection unit on a substrate surface,
a second substrate including a second electrical connection unit on a substrate surface,
a metal post provided on the first electrical connection unit,
a solder ball that electrically connects the second electrical connection unit and the metal post together,
a metal film that is provided between the metal post and the solder ball in one body from a tip surface to at least part of a side surface of the metal post and of which wettability to the solder ball is lower than wettability to the solder ball of the metal post, and
a sealing resin put in a gap between the first substrate and the second substrate.

(9)

A method for manufacturing a substrate device, including:
forming, on a substrate including an electrical connection unit on a substrate surface, a photosensitive material layer having an opening portion superimposed on the electrical connection unit;
forming a metal post in the opening portion of the photosensitive material layer;
subjecting the photosensitive material layer to light exposure treatment by using a photomask having a light transmissive portion that is superimposed on the opening portion of the photosensitive material layer and further has a larger outer diameter than the opening portion;
forming a metal film of which wettability to a solder material is lower than wettability to the solder material of the metal post, in one body from a tip surface to at least part of a side surface of the metal post; and
removing the photosensitive material layer.

(10)

The method for manufacturing a substrate device according to (9), in which a diameter of the light transmissive portion of the photomask is larger than a diameter of the opening portion of the photosensitive material layer by more than or equal to 20%.

(11)

The method for manufacturing a substrate device according to (9) or (10), in which, when the light transmissive portion, the photomask, and the light exposure treatment are referred to as a second light transmissive portion, a second photomask, and a second light exposure treatment, respectively, the second light exposure treatment is performed using the second photomask having the second light transmissive portion that has an outer diameter larger than an outer diameter of a first light transmissive portion of a first photomask that was used in a first light exposure treatment for forming the opening portion of the photosensitive material layer.

(12)

The method for manufacturing a substrate device according to (11), in which the photosensitive material layer contains a positive photosensitive material, and post-baking treatment after the first light exposure treatment is performed such that photosensitivity capacity of the photosensitive material layer is reserved, and the second light exposure treatment is further performed on the photosensitive material layer.

(13)

The method for manufacturing a substrate device according to (11) or (12), in which the second light exposure treatment is performed such that development is not performed up to a bottom surface of the photosensitive material layer.

(14)

The method for manufacturing a substrate device according to any one of (11) to (13), in which at least a side surface on a tip side of the metal post is caused to be exposed by performing the second light exposure treatment.

(15)

The method for manufacturing a substrate device according to any one of (11) to (14), in which, when the opening portion formed by the first light exposure treatment is referred to as a first opening portion, a second opening portion having an outer diameter larger than an outer diameter of the first opening portion is formed by the second light exposure treatment, and after the metal film is formed, a spherical solder material having a diameter larger than a diameter of the metal post when viewed in a height direction of the metal post is placed in the second opening portion and reflow processing is performed, and thereby a solder ball is formed on the metal film on a tip of the metal post.

(16)

The method for manufacturing a substrate device according to any one of (9) to (15), in which the metal film is formed by electrolytic plating processing of nickel.

REFERENCE SIGNS LIST 10 semiconductor device
20 semiconductor substrate (first substrate)
21 electrode pad (first electrical connection unit)
25 metal post
27 metal film
30 bump
31 solder ball
32 spherical solder material
40 wiring substrate (second substrate)
41 electrode pad (second electrical connection unit)
51 sealing resin
71 first photomask
73 first light transmissive portion
75 second photomask
77 second light transmissive portion
81, 83, 85 photosensitive material layer
82 first opening portion
84 second opening portion

The invention claimed is:

1. A substrate device, comprising:
a substrate;
an electrical connection unit on the substrate;
a metal post on the electrical connection unit; and
a metal film formed in one body from a tip surface of the metal post to at least part of a side surface of the metal post, wherein
a wettability of the metal film to a solder material is lower than a wettability of the metal post to the solder material.

2. The substrate device according to claim 1, wherein the metal film is a nickel film.

3. The substrate device according to claim 1, wherein the metal film on the at least part of the side surface of the metal post is in an area of more than or equal to 5 μm from a tip of the metal post.

4. The substrate device according to claim 1, wherein a thickness of the metal film located on the tip surface of the metal post is within a range of 1.5 to 4.0 μm.

5. The substrate device according to claim 1, further comprising
a solder ball on the metal film, wherein
the solder ball contains the solder material, and
a diameter of the solder ball is larger than a diameter of the metal post in a view of the substrate device along a height direction of the metal post.

6. The substrate device according to claim 5, wherein the diameter of the solder ball is larger than the diameter of the metal post by more than or equal to 20%.

7. The substrate device according to claim 1, wherein
the substrate is a semiconductor substrate, and
the substrate device is a semiconductor device.

8. An electronic apparatus, comprising:
a mounting structure of a semiconductor device, the mounting structure including:
a first substrate including a first electrical connection unit on a substrate surface of the first substrate;
a second substrate including a second electrical connection unit on a substrate surface of the second substrate;
a metal post on the first electrical connection unit;
a solder ball configured to electrically connect the second electrical connection unit and the metal post,
a metal film between the metal post and the solder ball, wherein
the metal film is formed in one body from a tip surface of the metal post to at least part of a side surface of the metal post, and
a wettability of the metal film to the solder ball is lower than a wettability of the metal post to the solder ball; and a sealing resin in a gap between the first substrate and the second substrate.

9. A method for manufacturing a substrate device, comprising:
forming, on a substrate including an electrical connection unit on the substrate, a photosensitive material layer having a first opening portion superimposed on the electrical connection unit;
forming a metal post in the first opening portion of the photosensitive material layer;
subjecting the photosensitive material layer to a first light exposure treatment by using a first photomask having a first light transmissive portion, wherein
the first light transmissive portion is superimposed on the first opening portion of the photosensitive material layer, and
an outer diameter of the first light transmissive portion is larger than an outer diameter of the first opening portion;
forming a metal film in one body from a tip surface of the metal post to at least part of a side surface of the metal post, wherein
a wettability of the metal film to a solder material is lower than a wettability of the metal post to the solder material; and
removing the photosensitive material layer.

10. The method for manufacturing the substrate device according to claim 9, wherein the outer diameter of the first light transmissive portion of the first photomask is larger than the outer diameter of the first opening portion of the photosensitive material layer by more than or equal to 20%.

11. The method for manufacturing the substrate device according to claim 9, further comprising subjecting the photosensitive material layer to a second light exposure treatment by using a second photomask having a second light transmissive portion, wherein
an outer diameter of the second light transmissive portion is larger than the outer diameter of the first light transmissive portion of the first photomask used in the first light exposure treatment for forming the first opening portion of the photosensitive material layer.

12. The method for manufacturing the substrate device according to claim 11, further comprising
performing a post-baking treatment after the first light exposure treatment such that photosensitivity capacity of the photosensitive material layer is reserved; and
subjecting the photosensitive material layer to the second light exposure treatment, wherein
the photosensitive material layer contains a positive photosensitive material.

13. The method for manufacturing the substrate device according to claim 11, further comprising performing the second light exposure treatment such that development is not performed up to a bottom surface of the photosensitive material layer.

14. The method for manufacturing the substrate device according to claim 11, further comprising exposing at least a side surface on a tip side of the metal post based on the second light exposure treatment.

15. The method for manufacturing the substrate device according to claim 11, further comprising:
forming a second opening portion by the second light exposure treatment, wherein an outer diameter of the second opening portion is larger than the outer diameter of the first opening portion;
placing a spherical solder material in the second opening portion after the metal film is formed, wherein a diameter of the spherical solder material is larger than a diameter of the metal post in a view in a height direction of the metal post; and
performing reflow processing to form a solder ball on the metal film on a tip of the metal post.

16. The method for manufacturing the substrate device according to claim 9, further comprising forming the metal film by electrolytic plating processing of nickel.

* * * * *